United States Patent
Mizuuchi et al.

(10) Patent No.: US 7,236,674 B2
(45) Date of Patent: Jun. 26, 2007

(54) OPTICAL WAVEGUIDE DEVICE, COHERENT LIGHT SOURCE USING THE SAME AND OPTICAL APPARATUS HAVING THE SAME

(75) Inventors: Kiminori Mizuuchi, Neyagawa (JP); Kazuhisa Yamamoto, Takatsuki (JP); Minoru Imaeda, Nagoya (JP); Tatsuo Kawaguchi, Motosu-gun (JP); Takashi Yoshino, Ama-gun (JP)

(73) Assignees: Matsushita Electric Industrial Co., Ltd., Osaka (JP); NGK Insulators, Ltd., Aichi (JP)

( * ) Notice: Subject to any disclaimer, the term of this patent is extended or adjusted under 35 U.S.C. 154(b) by 27 days.

(21) Appl. No.: 10/542,299

(22) PCT Filed: Dec. 22, 2003

(86) PCT No.: PCT/JP03/16488

§ 371 (c)(1),
(2), (4) Date: Jul. 14, 2005

(87) PCT Pub. No.: WO2004/063809

PCT Pub. Date: Jul. 29, 2004

(65) Prior Publication Data

US 2006/0257084 A1  Nov. 16, 2006

(30) Foreign Application Priority Data

Jan. 16, 2003 (JP) ............................. 2003-8780

(51) Int. Cl.
*G02B 6/10* (2006.01)
*G02F 1/35* (2006.01)
*H01S 3/10* (2006.01)

(52) U.S. Cl. .............. 385/130; 385/129; 385/131; 385/132; 359/326; 372/21

(58) Field of Classification Search .............. 385/122, 385/129–132; 359/326; 372/21
See application file for complete search history.

(56) References Cited

U.S. PATENT DOCUMENTS 5,734,772 A * 3/1998 Gopalan et al. ............ 385/122

(Continued)

FOREIGN PATENT DOCUMENTS

EP  1 139 162  10/2001

(Continued)

OTHER PUBLICATIONS

Kitaoka, et al., "Intracavity second-harmonic generation with a periodically domain-inverted $LiTaO_3$ device", Optics Letters, vol. 21, No. 24, Dec. 1996, pp. 1972-1974.

(Continued)

*Primary Examiner*—Brian Healy
*Assistant Examiner*—Charlie Peng
(74) *Attorney, Agent, or Firm*—Hamre, Schumann, Mueller & Larson, P.C.

(57) ABSTRACT

An optical waveguide device has a substrate composed of a nonlinear optical material and a periodically domain-inverted structure having the same composition as the nonlinear optical material, where the domain-inverted structure has a refractive index distribution relying on the domain-inverted structure.

27 Claims, 6 Drawing Sheets

U.S. PATENT DOCUMENTS

| | | | |
|---|---|---|---|
| 5,991,490 A * | 11/1999 | Mizuuchi et al. | 385/130 |
| 6,118,908 A * | 9/2000 | Bischel et al. | 385/14 |
| 6,363,189 B1 * | 3/2002 | Minakata et al. | 385/41 |
| 6,836,497 B1 | 12/2004 | Hatori | |
| 2001/0048705 A1 * | 12/2001 | Kitaoka et al. | 372/43 |
| 2001/0053167 A1 * | 12/2001 | Kitaoka et al. | 372/43 |
| 2002/0126369 A1 * | 9/2002 | Yamamoto et al. | 359/328 |
| 2003/0219046 A1 * | 11/2003 | Kitaoka et al. | 372/32 |
| 2004/0086012 A1 * | 5/2004 | Kitaoka et al. | 372/43 |

FOREIGN PATENT DOCUMENTS

| | | |
|---|---|---|
| JP | 6-194708 | 7/1994 |
| JP | 7-122809 | 5/1995 |
| JP | 2000-286498 | 10/2000 |

OTHER PUBLICATIONS

Hu, et al., "Phase-mapping of periodically domain-inverted $LiTaO_3$ with coherent X-rays", Nature, vol. 392, Apr. 1998. pp. 690-693.

Restoin, et al., "Ferroelectric domain inversion by electron beam on $LiTaO_3$ and Ti: $LiTaO_3$", Journal of Applied Physics, vol. 88, No. 11, Dec. 2000, pp. 6665-6668.

Kawaguchi, et al., New ridge-type $LiTaO_3$ optical waveguide for high-power QPM-SHG laser. Technical Report of IEICE, LQE220-8, May 2002. pp. 29-32.

Shinozaki, et al., "Self-quasi-phase-matched second-harmonic generation in the proton-exchanged $LiNbO_3$ optical waveguide with periodically domain-inverted regions", Applied Physics Letters 59(1991) Jul. 29, No. 5, pp. 510-512.

* cited by examiner

OPTICAL WAVEGUIDE DEVICE, COHERENT LIGHT SOURCE USING THE SAME AND OPTICAL APPARATUS HAVING THE SAME

TECHNICAL FIELD

The present invention relates to an optical waveguide device used in the fields of optical information processing and optical application measurement control, a coherent light source using the same and an optical apparatus having the same.

BACKGROUND ART

For an apparatus for recording and reproducing optical information, a high density can be realized by using a light source having a shorter wavelength. For example, while near infrared light of 780 nm is used for a widespread compact disk apparatus, a red semiconductor laser of 650 nm is used for a digital versatile disk (DVD) realizing a higher density information reproduction. Furthermore, for realizing a high density next-generation optical disk apparatus, a blue laser light source having a shorter wavelength has been developed keenly. For example, a wavelength converter using a nonlinear optical material has been developed for a small and stable blue laser light source.

For example, a QPM (quasi-phase matching)-SHG (second harmonic generation) element using a periodically domain-inverted structure can realize a highly efficient wavelength conversion. However, as the tolerance of the conversion wavelength is extremely narrow, a wavelength of an excitation light source should be fixed to a phase matching wavelength in order to obtain stable light source properties. For providing a small light source, a semiconductor laser must be used for the fundamental light source. However, since such a semiconductor laser has a wide gain and the oscillation wavelength fluctuates easily, a technique for stabilizing the wavelength will be highly valued. Here, a phase matching wavelength denotes a wavelength of a fundamental wave in a case where a fundamental wave transmitted in a periodically domain-inverted structure is converted to a harmonic.

A technique for providing a stable light source by using a QPM-SHG element and a semiconductor laser is an integration of a DBR (Distributed Bragg Reflector) grating in such a QPM-SHG element. This method includes using a DBR grating that has a wavelength selectivity so that an oscillation wavelength of a semiconductor laser is fixed to a reflection wavelength of the DBR grating by means of optical feedback.

Specifically, for an optical waveguide type QPM-SHG element, a DBR grating structure is formed on the optical waveguide. Such a DBR grating can be formed on the optical waveguide by etching, resist-grating or the like. In such a configuration, by feeding back a reflected light beam from the DBR grating to the semiconductor laser, an oscillation wavelength of the semiconductor laser can be fixed to this reflection wavelength.

For a method of forming a DBR grating on a SHG element, the use of a periodically domain-inverted structure for quasi-phase matching, as a DBR grating, has been proposed. For the periodically domain-inverted structure, a Ti diffusion $LiNbO_3$ is used. It is known that when Ti is diffused thermally into $LiNbO_3$, the polarization at the diffusion part will be inverted. Since the refractive index at this diffusion part is increased at the same time, it functions also as a refractive index grating having a periodic change in refractive index. Therefore, the domain-inverted structure can be used for the DBR grating. And the oscillation wavelength of the semiconductor laser can be fixed by harmonizing the DBR reflection wavelength and the phase matching wavelength. Thereby, a wavelength converter with a stable output can be realized. That is, a short wavelength light source having a semiconductor laser and a SHG element integrated with each other will be provided.

A similar method is applied for a KTP crystal. When a KTP crystal is subjected to an ion-exchange with Rb, the polarization is inverted and at the same time the refractive index at the ion-exchange portion is increased. This phenomenon is used to form a domain-inverted structure, and thereby a QPM structure and a DBR grating can be formed. In this manner, a short wavelength light source is provided.

Methods for forming such a DBR grating are disclosed, for example, in JP H06(1994)-194708.

However, the above-mentioned domain-inverted structure provides a change in refractive index as well as the domain-inverted structure, since it is accompanied with a composition change of the crystal. The reason is that metal diffusion or ion-exchange has been used in forming a domain-inverted structure. However, such a change in crystal composition can result in degradation of the crystal itself, and it may cause problems such as degradation of the crystal and reduction of resistance to optical damage. Thus such a structure cannot be used for an optical waveguide device that enables transmission of high-output light at high efficiency.

For example, a periodically domain-inverted structure formed by Ti diffusion on a $LiNbO_3$ crystal can be used as a DBR grating, as it is accompanied with an increase in refractive index. However, the domain inversion caused by the Ti diffusion on the $LiNbO_3$ substrate will not provide a sufficient depth of the domain inversion. Particularly, it is difficult to form a domain-inverted structure having a period of not more than 3 µm, which is required for a wavelength of about 400 nm or less. Moreover, when Ti is diffused, impurity concentration in the optical waveguide increases and the resistance to optical damage will deteriorate. As a result, the output may be unstable at the time of output that is as high as at least several milliwatts.

In a method of ion-exchanging the KTP crystal with Rb, a domain-inverted structure and a change in refractive index can be provided by the Rb ion exchange. However, since the Rb as an impurity enters the crystal, it will be difficult to provide high output, similarly to the case of Ti diffusion. Furthermore, since a large difference in the grating constants is provided between the ion exchange portion and non-exchange portion due to the ion exchange with the Rb, distortion or the like may occur in the crystal at the inverted part, thereby increasing a loss in the transmission in the optical waveguide.

Recently, techniques for domain inversion in a nonlinear optical crystal have been improved further. The above-mentioned methods of forming domain inversion by means of an initial ion exchange or metal diffusion have been replaced by a method of producing a domain-inverted structure through application of a high electric-field pulse by means of a pattern electrode. Specifically, a method of applying a high voltage pulse to a ferroelectric substance via a pattern electrode enables formation of a uniform domain-inverted structure without changing the composition of the crystal, and further formation of a domain-inverted shape with a high aspect ratio. When forming a domain-inverted structure in this method, the direction of the nonlinear polarization will be inverted by changing slightly a distribution of atoms in the crystal, and this will not be accompanied with changes in the composition and structure of the crystal. Since impurities will not be mixed in, problems such as degradation of the crystal or the degradation in the resistance to the optical damage will not occur. A high nonlinearity and resistance to optical damage can be realized, and thus an optical waveguide device with high efficiency and high output can be provided. However, since there is no change in the crystal composition, changes in refractive index will not occur and thus it cannot be used for a DBR grating.

As there is no change in the crystal composition in a domain-inverted structure, optical changes will not appear and thus the domain-inverted structure cannot be used as a refractive index grating structure just like the prior art. That is, when there is no difference in the crystal structures in the domain-inverted portion and the non-inverted portion, no optical difference will occur. Therefore, a refractive grating structure will not be formed.

DISCLOSURE OF INVENTION

In view of the above-stated problems, an object of the present invention is to provide an optical waveguide device according to the present invention, a coherent light source using the same and an optical apparatus having the same, which will provide a short wavelength light source that is highly efficient and stable.

An optical waveguide device according to the present invention includes: a substrate made of a nonlinear optical material, and a periodically domain-inverted structure made of the same composition as that of the substrate, wherein the domain-inverted structure has a refractive index distribution relying on the structure. Thereby, a high nonlinearity and a resistance to optical damage can be realized, so that a DBR grating structure with a high efficiency and high output can be realized, and thus it can be used as a wavelength converter, for example.

It is also preferable that the domain-inverted structure is formed by applying voltage in a polarization direction of the substrate. Thereby, as a change in composition of the crystal will not occur, an optical waveguide device with high efficiency and high output can be realized.

It is also preferable that the substrate made of the nonlinear optical material is an offcut substrate. Thereby, regardless of its domain-inverted structure formed by an electric field application, a DBR grating structure due to a change in refractive index is formed.

It is also preferable that an offcut angle of the substrate is inclined in a range of 1° to 10° with respect to the substrate surface. Thereby, reflectance from the DBR grating is increased.

It is also preferable that the substrate has an optical substrate as a thin film bonded to one face of the substrate via an adhesive layer. Thereby, reflectance from the DBR grating is increased.

It is also preferable that a convex is formed on at least either the surface or back face of the substrate, and that the domain-inverted structure is formed in stripes on the convex. Thereby, a ridge-type optical waveguide device is provided, where crystal distortion formed will not be influenced by the domain inversion, and thus the change in refractive index can be maintained. As a result, a high DBR reflection can be realized, and the DBR grating has a high efficiency.

It is also preferable that the nonlinear optical material is a Mg-doped $LiNb_{(1-x)}Ta_xO_3$ ($0 \leq x \leq 1$). Thereby, the domain-inverted structure is formed.

It is also preferable that the nonlinear optical material is a Mg-doped $LiNbO_3$ crystal, where the phase matching wavelength harmonizes with a Bragg reflection wavelength, and the Bragg reflection wavelength $\lambda$ satisfies a relationship of $\lambda_1 < \lambda < \lambda_2$, and a relationship of $\lambda_1 = 635 + 48 \times n$ (nm) and $\lambda_2 = 1.02 \times \lambda_1$ (nm) (n=0, 1, 2), or $\lambda_1 = 774 + 40 \times n$ (nm) and $\lambda_2 = 1.02 \times \lambda_1$ (nm) (n=0, 1, 2, 3, 4 . . . ). As a result, the Bragg reflection wavelength $\lambda$ and the phase matching wavelength harmonize with each other, and thus a harmonic can be generated.

It is also preferable that the nonlinear optical material is a Mg-doped $LiNbO_3$ crystal, where the phase matching wavelength harmonizes with a Bragg reflection wavelength, and the Bragg reflection wavelength $\lambda$ satisfies a relationship of $\lambda_1 < \lambda < \lambda_2$, and a relationship of $\lambda_1 = 613 + 48 \times n$ (nm) and $\lambda_2 = 1.02 \times \lambda_1$ (nm) (n=0, 1, 2), or $\lambda_1 = 754 + 40 \times n$ (nm) and $\lambda_2 = 1.02 \times \lambda_1$ (nm), (n=0, 1, 2, 3, 4 . . . ). As a result, the Bragg reflection wavelength $\lambda$ and the phase matching wavelength harmonize with each other, and thus a harmonic can be generated.

It is also preferable that the domain-inverted structure is composed of a wavelength-converting portion and a DBR portion, wherein the phase matching wavelength of the wavelength-converting portion is equal to the Bragg reflection wavelength of the DBR portion, and a difference between the phase matching wavelength of the wavelength-converting portion and the Bragg reflection wavelength of the wavelength-converting portion is at least 5 nm. As a result, the Bragg reflection wavelength $\lambda$ and the phase matching wavelength harmonize with each other, and thus a harmonic can be generated.

A coherent light source according to the present invention has a semiconductor laser and the optical waveguide device as mentioned above, and a light beam emitted from the semiconductor laser enters the optical waveguide device. Thereby, a coherent light source that can emit a highly-efficient and stable short wavelength light beam can be realized.

An optical apparatus according to the present invention has the above-mentioned coherent light source. In this manner, an optical apparatus having a high-output coherent light source can be realized.

DESCRIPTION OF THE INVENTION

In general, a domain inversion in a ferroelectric substance is caused by a change in a crystal structure. However, since only the crystal structure is inverted while there is no structural and/or compositional change in the domain-inverted structure, no change will occur in the refractive index or the like. It has been reported that when the polarization is inverted by applying an electric field, the inner electric field remains so that the refractive index changes temporarily due to the electro-optic effect. However, the change in the refractive index is temporary, and thus it extinguishes over time. Moreover, the change in refractive index is unstable, and specifically it extinguishes in a process of a comparatively low temperature of about 100° C.

However, the inventors found that when a domain-inverted structure is formed on a nonlinear optical material, a change in periodic refractive index relying on the structure can be maintained permanently. Based on this, the inventors completed an optical waveguide device of the present invention.

Hereinafter, embodiments will be described more specifically.

FIRST EMBODIMENT

Figure 1:
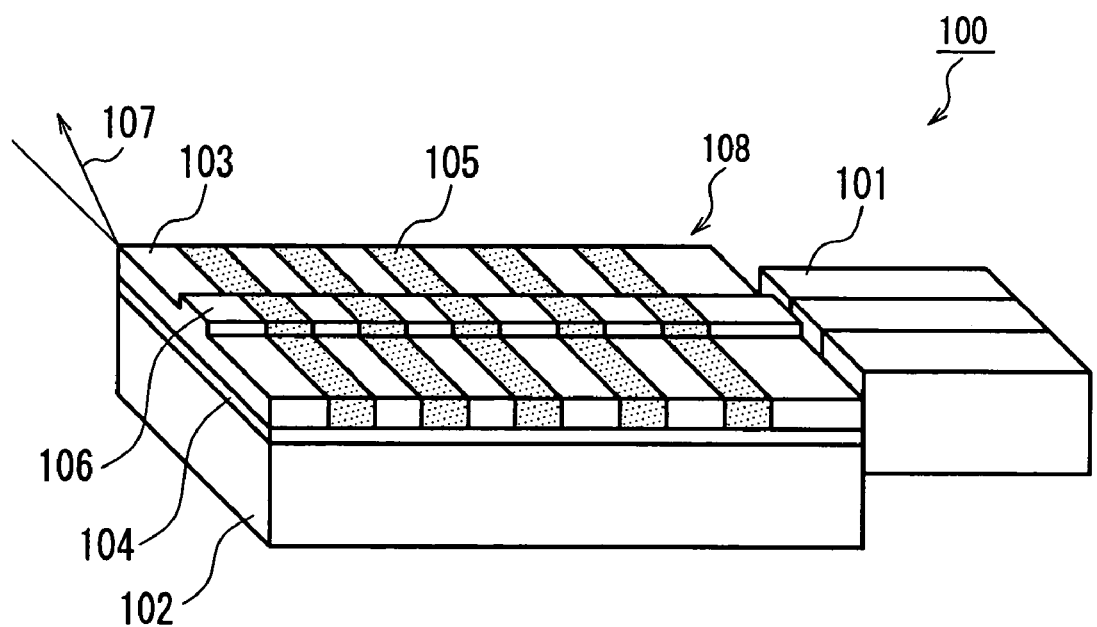
FIG. 1 is a perspective view showing a configuration of a coherent light source using an optical waveguide device according to a first embodiment.

An optical waveguide device according to a first embodiment of the present invention and a coherent light source using the same will be described below. FIG. 1 is a diagram showing a coherent light source using an optical waveguide device according to the first embodiment of the present invention. The coherent light source 100 in the first embodiment has a semiconductor laser 101 and an optical waveguide device 108 as an optical wavelength converter.

The optical waveguide device 108 is configured by adhering an offcut thin film layer 103 of a Mg-doped LiNbO$_3$ crystal onto a LN substrate 102 via a bonding layer 104. On the thin film layer 103, a striped convex 106 is formed. The optical waveguide device 108 having this convex 106 as a ridge waveguide is a so-called ridge-type waveguide structure. On the thin film layer 103, a periodic periodically domain-inverted region 105 is formed. Since the thin film layer 103 is made of an offcut substrate, a polarization direction 107 of this domain-inverted region 105 is inclined with respect to the surface of the thin film layer 103. For the semiconductor laser 101 for example, a Fabry-Perot type AlGaAs semiconductor laser is used. The domain-inverted region 105 has a domain-inverted period of about 2.8 μm, and the phase matching wavelength is about 820 nm. The domain-inverted region 105 has a periodic refractive index distribution and exhibits DBR grating characteristics.

A light beam emitted from the semiconductor laser 101 enters the optical waveguide device 108 so as to be subjected to a wavelength selection by the domain-inverted region 105 and fed back to the semiconductor laser 101. Thereby, the light emitted from the semiconductor laser 101 is fixed to a wavelength of 820 nm being one of the DBR reflection wavelength of the domain-inverted region 105 that is present in the vicinity of an oscillation-gain of the semiconductor laser 101. In this manner, a highly-efficient and stable short wavelength light beam is emitted from the coherent light source 100. As mentioned above, by harmonizing the phase matching wavelength and the DBR reflection wavelength in the domain-inverted region 105 exhibiting the DBR grating properties, the wavelength of the light beam emitted from the semiconductor laser 101 can be converted stably.

Next, an example of a method for producing the optical waveguide device 108 will be described by referring to FIGS. 2A-2D and FIGS. 3A-3C. FIGS. 2A-2D are diagrams showing a process of forming a periodically domain-inverted structure, and FIGS. 3A-3C are diagrams showing a process of forming a ridge-type optical waveguide structure.

Figure 2A:
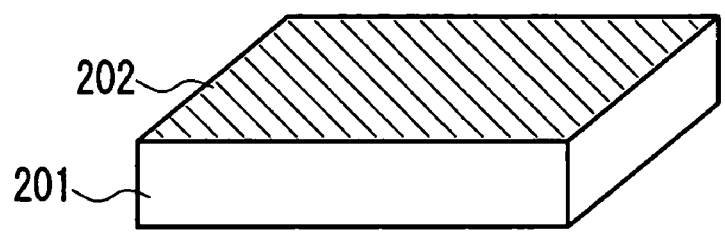
FIG. 2A is a diagram showing a process of forming a periodically domain-inverted structure.
Figure 3A:
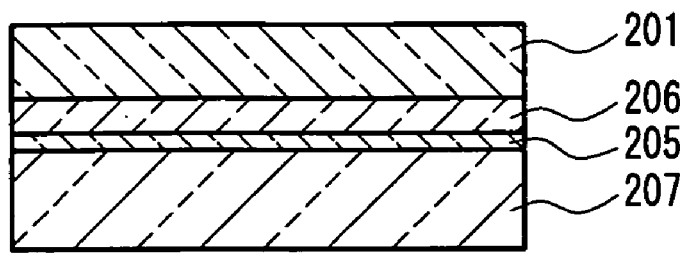
FIG. 3A is a diagram showing a process of forming a ridge-type optical waveguide structure.
Figure 3B:
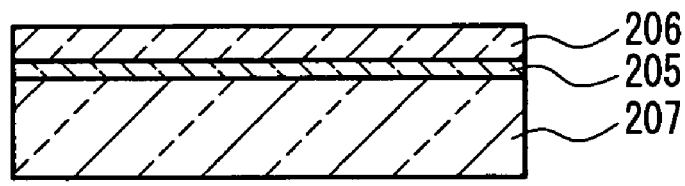
FIG. 3B is a diagram showing a process of forming a ridge-type optical waveguide structure.
Figure 3C:
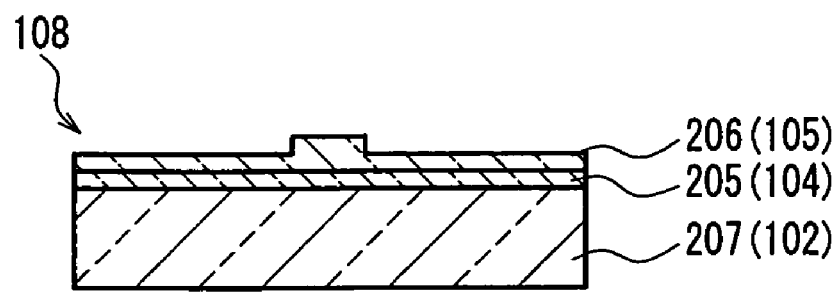
FIG. 3C is a diagram showing a process of forming a ridge-type optical waveguide structure.

First, as shown in FIG. 2A, a metal film 202 of Ta or the like is formed on a surface of a Mg-doped LiNbO$_3$ substrate 201 as a 5°-offcut substrate. For obtaining a uniform change in refractive index, a Mg mol concentration on this LiNbO$_3$ substrate is preferably in range of 4.8 to 6 mol %. In this Mg-doped LiNbO$_3$ substrate 201, the Mg mol concentration is 5 mol %, for example. The 5°-offcut substrate denotes a substrate having a C-axis inclined by 5° with respect to the crystal surface.

Figure 2B:
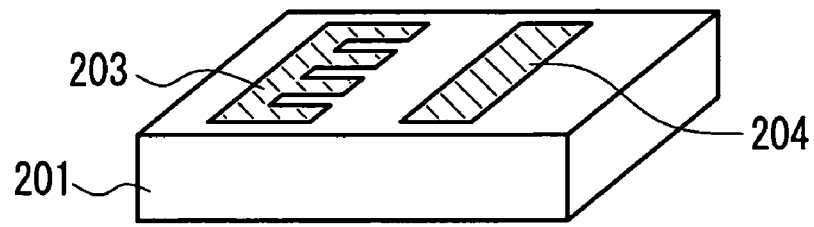
FIG. 2B is a diagram showing a process of forming a periodically domain-inverted structure.

Next, as shown in FIG. 2B, the metal film 202 formed on the Mg-doped LiNbO$_3$ substrate 201 is subjected to a photo-dry etching so as to form a comb-shaped electrode 203 having a periodic pattern and a stripe electrode 204 pairing up with the comb-shaped electrode 203, on the substrate 201.

Figure 2C:
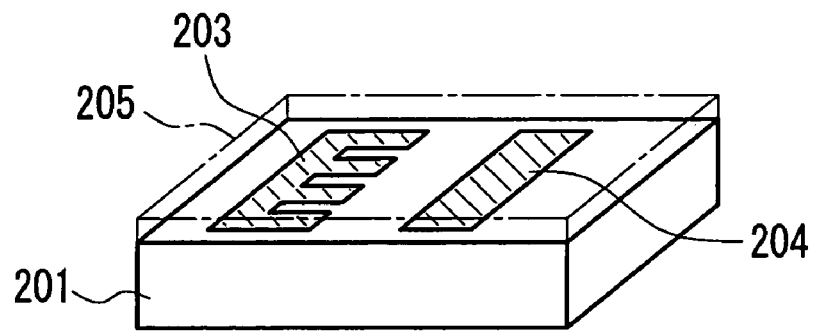
FIG. 2C is a diagram showing a process of forming a periodically domain-inverted structure.

Next, as shown in FIG. 2C, on the Mg-doped LiNbO$_3$ substrate 201 and also the comb-shaped electrode 203 and the stripe electrode 204 formed thereon, an insulating film 205, e.g., a SiO$_2$ film, is formed.

Figure 2D:
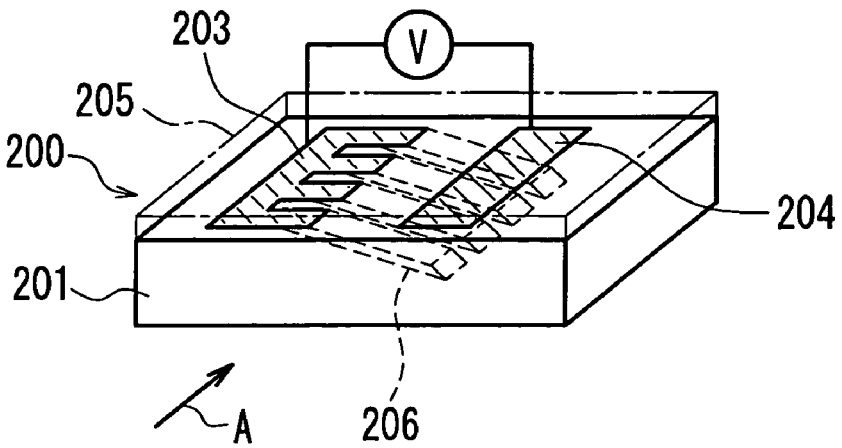
FIG. 2D is a diagram showing a process of forming a periodically domain-inverted structure.

Next, as shown in FIG. 2D, a pulse voltage is applied between the comb-shaped electrode 203 and the stripe electrode 204 in a polarization direction of the Mg-doped LiNbO$_3$ substrate 201, so that a periodically domain-inverted structure 206 is formed on the Mg-doped LiNbO$_3$ substrate 201 in accordance with a pattern of the comb-shaped electrode 203. In this manner, a substrate 200 having a domain-inverted structure is formed.

Next, a method for producing an optical waveguide device 108 having the ridge-type optical waveguide structure as in FIG. 1, using the substrate 200, is explained below by referring to FIGS. 3A to 3C. FIGS. 3A-3C are cross-sectional views showing the substrate 200 from a direction 'A' in FIG. 2D. First, as shown in FIG. 3A, on a surface of the insulating film 205 in the structure as shown in FIG. 2D, a LN substrate (=LiNbO$_3$ substrate) 207 is adhered. In FIG. 2D, the domain-inverted structure 206 arranged obliquely with respect to the substrate 201 has an inclination of only about several degrees. Therefore, though the domain-inverted structure 206 is actually inclined with respect to the substrate 201 by several degrees, it is illustrated as being parallel in each of FIGS. 3A-3C for convenience.

Next, as shown in FIG. 3B, the Mg-doped LiNbO$_3$ substrate 201 is abraded to a thickness of several micrometers. Thereby, the domain-inverted structure 206 is exposed on the surface.

Next, as shown in FIG. 3C, the domain-inverted structure 206 is subjected further to a ridge-process so as to form a ridge-type optical waveguide. In this manner, the optical waveguide device 108 as shown in FIG. 1 is manufactured. In FIG. 3C, components corresponding to the respective components in FIG. 1 are indicated by references in parentheses.

The optical waveguide device 108 as an optical waveguide-type SHG element has a high conversion efficiency and excellent resistance to optical damage. The reason is as follows.

First, unlike an ordinary optical waveguide device, the optical waveguide device 108 is formed without injection of impurities for increasing the refractive index of its optical waveguide. The ridge-type waveguide of the optical waveguide device 108 is a bulk Mg-doped LiNbO$_3$ crystal containing no impurities. Therefore, the optical waveguide device 108 has a high nonlinearity and high resistance to optical damage, thereby providing a highly-efficient and high-output optical wavelength converter.

Regarding the optical waveguide device 108 having the periodically domain-inverted structure manufactured in the above-mentioned method, a reflection having a selectivity was observed in an actual measurement for light in the vicinity of a wavelength of 815 nm. In a further examination, similar reflections were observed at an interval of a wavelength of 400 nm, and thus the wavelength was found to rely on a domain-inverted period.

Furthermore, though the optical waveguide device 108 has the domain-inverted structure 206 formed by electric field application, a DBR grating for causing a change in refractive index is formed. One of the factors is that an offcut substrate is used for the substrate 201. As mentioned above, an offcut substrate denotes a substrate where a C-axis of the crystal is inclined with respect to the substrate surface. An angle formed by the C-axis of the crystal with respect to the substrate surface is called an offcut angle. A conventional optical waveguide device has been formed by using a substrate with a crystal orientation of a Z- or X-cut. In the first embodiment, an offcut substrate of a Mg-doped LiNbO$_3$ was used for manufacturing the optical waveguide device 108. In a case where the domain-inverted region 105 is formed by applying an electric field to the offcut substrate, the thus formed domain-inverted region 105 grows in a needle shape in a depth direction obliquely with respect to the surface of the optical waveguide device 108 along the polarization direction. Since asymmetric distortion occurs in the crystal at the time that the domain inversion grows in the oblique direction, distortion remains at the boundary between the inverted portion and non-inverted portion, and this is considered to cause the change in refractive index. That is, a certain crystal distortion remains at the boundary between the domain-inverted portion and the non-inverted portion so as to generate a difference in the refractive indices, so that the refractive index grating structure is formed apparently. On the other hand, a periodic refractive index distribution was not formed substantially when a similar method was used to form a domain inversion with respect to Z-cut and X-cut substrates.

When the offcut angle was in a range of 1° to 10°, a large DBR reflection was observed. An offcut angle in a range of 10° to 30° can be used as the DBR grating structure since a change in refractive index is observed for the range. Therefore, a workable range for the offcut angle is 1° to 30°, but the range of 1° to 10° is particularly preferred.

The offcut substrates used here include an offcut X substrate, an offcut Y substrate and an offcut XY substrate. The offcut X substrate is a substantially X-cut substrate, where the substrate surface is parallel to a Y-axis and the C-axis is inclined at an angle θ relative to the substrate surface. As for the offcut Y substrate, the substrate surface and the X-axis are parallel to each other, and the substrate surface and the C-axis are inclined relative to each other by an angle of θ. The offcut XY substrate is not any of these substrates (i.e., the substrate plane is not parallel to either X or Y). Among these substrates, the offcut Y substrate has the largest change in refractive index and the largest Bragg reflection when being processed into a periodically domain-inverted structure. The offcut XY substrate is the second in the change in refractive index and Bragg reflection, and the offcut X substrate is the third. Particularly, the offcut XY substrate is preferred since the transmission loss of the optical waveguide device 108 tends to be decreased at a position where the substrate surface is inclined by at least 5° from the X- and Y-axes.

Moreover, the DBR grating structure in the optical waveguide device 108 manufactured in the above-mentioned method is thermally stable. For example, when a fundamental wave enters the optical waveguide device 108 prepared by forming a domain-inverted structure having a period of 2.8 µm on a 5°-offcut substrate over a length of 10 mm, reflectance of at least 90% was observed for a fundamental wave having a wavelength of 820 nm.

Furthermore, the optical waveguide device 108 was annealed to check a change in the reflectance. The annealing was carried out at temperature of 400° C. and 600° C. for at least 5 hours, and subsequently the reflectance was measured. The result showed that there was no change in the reflectance before and after the annealing for any samples regarding the DBR reflection wavelength and the reflectance. This indicates that the refractive index grating formed in the domain-inverted region 105 was remarkably stable. Even after keeping the sample in an uncontrolled environment for several months, no changes were found in the reflection wavelength and the reflectance property of the optical waveguide device 108, thereby showing that a permanently stable refractive index grating was formed.

One of the factors for the domain-inverted region 105 to function as a refractive index grating is the optical waveguide structure as illustrated in FIG. 1. Namely, as mentioned above, the domain-inverted region 105 is formed as a thin film to be used as an optical waveguide. Specifically, by making a thin film layer 103 having a thickness of about 3-4 µm, functions of the optical waveguide device will be exhibited further advantageously. Due to the decrease in film thickness, the reflectance from the DBR grating was increased. The reason may be that the distortion of the crystal at the boundary of the domain-inverted portion is intensified due to the decrease in the film thickness, and thereby the change in refractive index was increased. The thickness of the thin film layer 103 is preferably 10 µm or less. More preferably, the thickness is 5 µm or less, so that the change in refractive index of the domain-inverted region 105 is increased.

By making the optical waveguide device 108 as a ridge-processed waveguide, the reflectance from the DBR grating is increased in comparison with a case of a proton exchange waveguide formed as a domain-inverted structure. In general, such a proton exchange waveguide is used for an optical waveguide of a domain-inverted structure since it allows formation of a low-loss and uniform waveguide. In an observation, however, the reflectance of the DBR grating is reduced considerably when the thus formed domain-inverted structure is subjected to a proton exchange, probably because the crystal distortion formed due to the domain inversion is relaxed at the time of performing the proton exchange.

Since the optical waveguide device 108 is obtained through abrasion and ridge processing, the domain-inverted region 105 is not subjected to any chemical treatment. Therefore, the formed crystal distortion will not be influenced by the domain-inverted structure, and thus the change in refractive index will be maintained. This is preferred since a high DBR reflection can be realized and the DBR grating efficiency is improved.

Even for a proton exchange waveguide, the DBR reflection will be observed when an offcut substrate is used for the formation. Therefore, although the DBR reflection is reduced considerably due to the proton exchange, the DBR grating with a domain-inverted structure can be formed as well in a proton exchange waveguide, in accordance with the above-mentioned manufacturing process.

It is also preferable that Mg-doped $LiNbO_3$ as a nonlinear optical crystal is used for the substrate (thin film layer 103) composing the DBR grating. When a $LiNbO_3$ substrate that is used in general is an offcut substrate, a uniform grating is difficult to form. In a case of a domain-inverted structure, a DBR grating is difficult to form. For the nonlinear optical crystal, Mg-doped $LiNb_{(1-x)}Ta_xO_3$ ($0 \leq x \leq 1$) can be used. For example, any of the following crystals can be used similarly for the nonlinear optical crystal: Mg-doped $LiTaO_3$, Mg-doped $LiNbO_3$, mixed crystal of Mg-doped $LiNbO_3$ and $LiTaO_3$, Mg-doped stoichiometric $LiNbO_3$, Mg-doped stoichiometric $LiTaO_3$, and a mixed crystal of Mg-doped stoichiometric $LiNbO_3$ and Mg-doped stoichiometric $LiTaO_3$.

It is preferable that the doping amount of Mg is about 4.8 mol % to about 6 mol % for a congruent $LiNbO_3$ crystal. When the doping amount exceeds 6 mol %, formation of domain inversion will be hindered. When the doping amount is less than 4.8 mol %, resistance of the substrate 201 to optical damage will be degraded considerably. For a case of the stoichiometric $LiNbO_3$, the doping amount for Mg is at least 1.5 mol %, preferably.

When light is outputted from the coherent light source 100, it is preferable that a light beam emitted from the semiconductor laser 101 enters the optical wave guide device 108, and the gain-peak wavelength of the light emitted from the semiconductor laser 101 and the wavelength of the DBR reflection from the domain-inverted region 105 are substantially equal to each other. When the wavelengths differ considerably, the oscillation wavelength of the semiconductor laser will not be fixed to the DBR reflection wavelength. In an experiment, the difference in wavelengths was required not to exceed 5 nm. The difference of not more than 2 nm is more preferred since the output becomes stable.

When forming the optical waveguide device 108, a nonlinear optical material as a thin film can be adhered to the LN substrate 102 with an adhesive. Alternatively, techniques such as direct bonding can be used as well.

The above description is about a case where the optical waveguide device 108 has a DBR grating structure that uses a domain-inverted structure. The change in refractive index caused by the domain-inverted structure can be applied to other devices, such as various grating devices, phase modulators, switches, wavelength-selection gratings, wavelength dividing/combining devices or the like and polarizers or the like, and also an optical waveguide devices or the like configured to provide a partial refractive index distribution to its waveguide. The domain-inverted structure, which can be formed to have an arbitrary shape, is effective.

Alternatively, the coherent light source 100 in the first embodiment can be configured by directly bonding the optical waveguide device 108 to the semiconductor laser 101. Or it can be configured by using a lens optical system, in addition to the optical waveguide device 108 and the semiconductor laser 101. By configuring as mentioned above, the optical waveguide device 108 and the semiconductor laser 101 can be optically coupled further easily.

The following description is about a wavelength condition for a case of obtaining a harmonic output in a coherent light source 100 composed of the semiconductor laser 101 and the optical waveguide device 108. A Fabry-Perot semiconductor laser 101 is fixed to a DBR reflection wavelength provided by a domain-inverted structure and oscillates stably. Moreover, by harmonizing the DBR reflection wavelength and the phase matching wavelength through temperature control, a stable harmonic can be obtained.

For forming a highly-efficient coherent light source 100 with these semiconductor laser 101 and the optical waveguide device 108, the phase matching wavelength of the optical waveguide device 108 and the DBR reflection wavelength must be harmonized with each other. Since the phase matching wavelength and the DBR reflection wavelength are values respectively relying on the periodic structure of the domain-inverted structure, there is a certain law for harmonizing the phase matching wavelength of the optical waveguide device 108 and the DBR reflection wavelength. Specifically, it has been found that an optimum condition can be obtained when being offset from a point of harmonization between the DBR reflection wavelength and the phase matching wavelength, which is calculated on the basis of a condition obtained from a dispersion characteristics of the crystal.

The reason is considered as follows. Since the optical waveguide device 108 has a structure obtained by processing the crystal itself to a ridge waveguide state unlike the conventional techniques, a DBR condition in the optical waveguide becomes different from the phase matching condition.

The following is a result of an experiment to obtain an optimum output wavelength of a coherent light source 100 at around room temperature (0° C. to 100° C.). First, a DBR reflection wavelength $\lambda$ for a case where the DBR grating has an odd-order DBR reflection wavelength harmonizing with the phase matching wavelength satisfies the following conditions.

The DBR reflection wavelength $\lambda$ satisfies a relationship of $\lambda_1 < \lambda < \lambda_2$. Here, $\lambda_1 = 635 + 48 \times n$ (nm), $\lambda_2 = 1.02 \times \lambda_1$ (nm), where (n=0, 1, 2). When the DBR reflection wavelength $\lambda$ is larger than the value obtained by the above equation, $\lambda_1 = 774 + 40 \times n$ (nm), $\lambda_2 = 1.02 \times \lambda_1$ (nm), where (n=0, 1, 2, 3, 4 . . . ). Here, $\lambda$ takes a value between $\lambda_1$ and $\lambda_2$, depending on the width and thickness at the ridge portion of the optical waveguide device 108.

Namely, a wavelength where the DBR reflection wavelength $\lambda$ and the phase matching wavelength harmonize with each other appears at every about 40 nm. The order of the DBR grating is the 15$^{th}$, and reflection is obtained at every odd-order. Since the domain-inverted structure has a first order periodic structure for a nonlinear grating that converts a fundamental wave to a second-order harmonic, the duty ratio of the domain-inverted portion to the non-inverted portion is 50% at a point where the conversion efficiency is maximized. An accurate determination with an error of 1% to 2% was obtained. The remaining conditions for the optical waveguide device 108 were substantially conditions of a single mode with respect to the fundamental wave, and thus it did not rely so much on the shape of the waveguide.

By changing the temperature of the optical waveguide device 108, the DBR reflection wavelength and the phase matching wavelength can be harmonized accurately. Both the phase matching wavelength and the DBR reflection wavelength have temperature dependency. For example, the temperature dependency of the phase matching wavelength is 0.06 nm/° C. and the temperature dependency of the DBR reflection wavelength is 0.026 nm/° C. Therefore, by using the wavelength fluctuation caused by the temperature change, the phase matching wavelength and the DBR reflection wavelength can be harmonized precisely. In an alternative method, an electrode structure is formed on the optical waveguide device 108, to which a voltage is applied so as to change the executive refractive index of the optical waveguide device 108 for harmonizing the DBR reflection wavelength and the phase matching wavelength with each other.

The optical waveguide device 108 has a length of 12 mm, a domain-inverted period of about 2.8 µm, and a phase matching wavelength of about 820 nm. The phase matching wavelength and the DBR reflection wavelength harmonize substantially with each other. However, since the DBR grating has reflectance of about 90%, almost all the light beams were reflected. The conversion efficiency for the optical wavelength converter will be lowered when the reflection of the DBR grating is large. Moreover, when the power for feedback to the semiconductor laser 101 is excessively large, the semiconductor laser 101 may be destroyed due to damage at the end face. Therefore, the reflectance by the DBR grating is preferably suppressed to 10% or lower.

By controlling the duty ratio of the domain-inverted region 105, the reflectance of the DBR grating is controlled. That is, the reflectance of the DBR grating can be controlled by shifting the width of the domain-inverted region 105 by 0.1 µm, and thus the reflectance of the DBR grating can be adjusted without degrading the conversion efficiency for the optical wavelength converter.

Similarly, regarding an even-ordered DBR wavelength, the DBR wavelength and the phase matching wavelength can be harmonized with each other. In this case, the DBR reflection wavelength λ satisfies a relationship of $\lambda_1 < \lambda < \lambda_2$ where $\lambda_1 = 613 + 48 \times n$ (nm), $\lambda_2 = 1.02 \times \lambda_1$ (nm), (n=0, 1, 2). Alternatively, the DBR reflection wavelength satisfies a relationship of $\lambda_1 < \lambda < \lambda_2$ where $\lambda_1 = 754 + 40 \times n$ (nm), $\lambda_2 = 1.02 \times \lambda_1$ (nm), (n=0, 1, 2, 3, 4 . . . ).

In this case, however, as reflection will not occur when the duty ratio of the domain-inverted region 105 is 50%, the duty ratio must be offset from 50%. When taking the conversion efficiency to SHG into consideration, the efficiency can be improved by making the duty ratio to about 40-49% and by suppressing the reflectance to 10% or less. In this case, degradation of the conversion efficiency, which is caused by restriction of the reflection degree of the Bragg reflection and by the offset of the duty ratio from 50%, can be prevented. When more stable characteristics are desired even if the SHG output is suppressed, the reflectance can be increased by controlling the duty ratio to a range of 30% to 40%. Though the conversion efficiency is reduced, light feedback to the semiconductor laser 101 can be increased to suppress fluctuation of the oscillation wavelength of the semiconductor laser 101, which is caused by disturbance.

Figure 4:
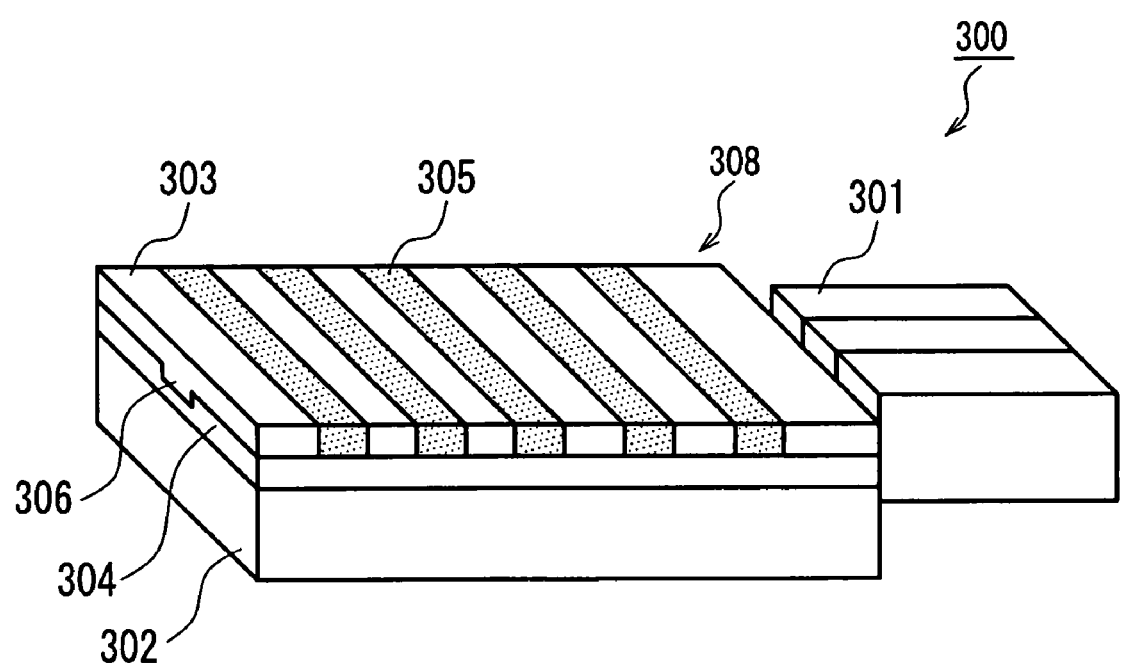
FIG. 4 is a perspective view showing another configuration example of a coherent light source using an optical waveguide device according to the first embodiment.

Alternatively, the optical waveguide device 108 can be formed so that the convex 106 of the thin film layer 103 is in contact with the LN substrate 102 side, i.e., with the bonding layer 104. A specific example is illustrated in FIG. 4. FIG. 4 is a diagram showing another configuration example of a coherent light source using an optical waveguide device according to the first embodiment. An optical waveguide device 308 is configured by adhering an offcut Mg-doped LiNbO$_3$ crystal thin film layer 303 on a LN substrate 302 via a bonding layer 304. The thin film layer 303 has a striped convex 306, and a periodically domain-inverted region 305 is formed. The LN substrate 302 and the thin film layer 303 are arranged such that the convex 306 is arranged inside the optical waveguide device 308, facing the LN substrate 302. A coherent light source 300 is made up by the optical waveguide device 308 and a semiconductor laser 301 for emitting light to the optical waveguide device 308. The thus configured optical waveguide device 308 can provide a highly-efficient and high-output DBR grating structure for an optical waveguide similar to the optical waveguide device 108 in FIG. 1, and it can be used for a wavelength converter. Moreover, the coherent light source 300 can emit highly-efficient and stable short wavelength light just like the coherent light source 100 in FIG. 1 does.

SECOND EMBODIMENT

Figure 5:
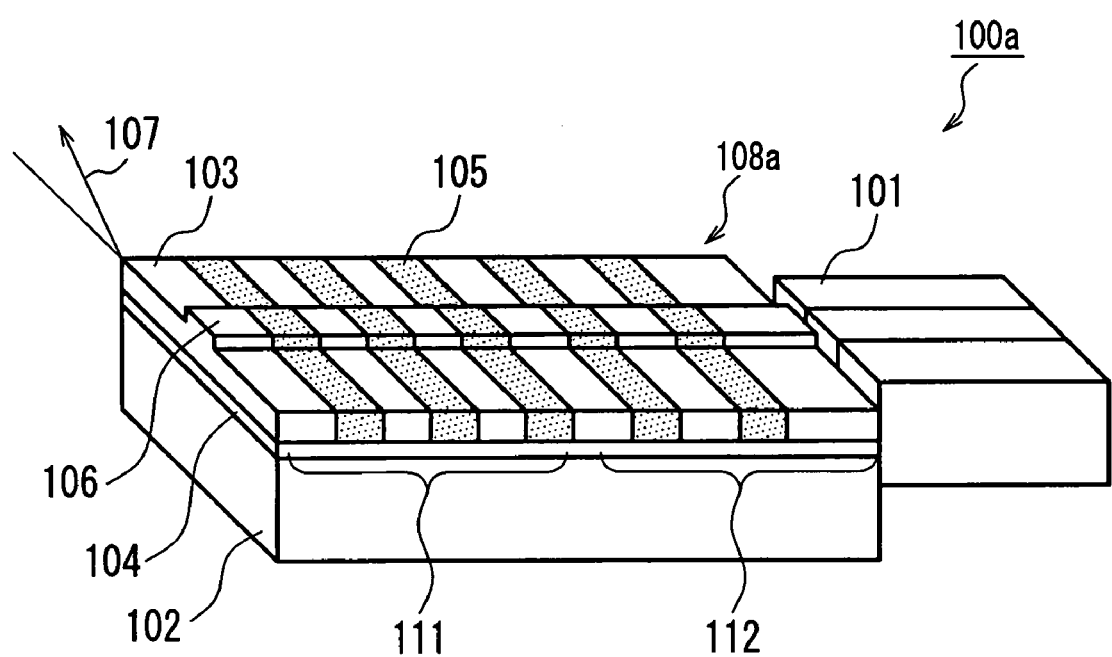
FIG. 5 is a perspective view showing a configuration example of a coherent light source using an optical waveguide device according to a second embodiment.

The description below refers to an optical waveguide device according to a second embodiment of the present invention and a coherent light source using the same. FIG. 5 is a diagram showing a coherent light source using an optical waveguide device according to the second embodiment.

A coherent light source 100a according to the second embodiment as shown in FIG. 5 has an optical waveguide device 108a in place of the optical waveguide device 108 of the coherent light source in the first embodiment, and a domain-inverted region 105 of this optical waveguide device 108a is separated into a DBR portion 112 and a wavelength-converting portion 111. The semiconductor laser 101 is a Fabry-Perot AlGaAs semiconductor laser similarly to the first embodiment. However, unlike the first embodiment, the domain-inverted region 105 has a domain-inverted period of about 2.7 µm and a phase matching wavelength of about 810 nm.

Both the DBR portion 112 and the wavelength-converting portion 111 have periodically domain-inverted structures, but the periods are different from each other. For the wavelength-converting portion 111, a periodic structure for phase-matching a fundamental wave and a harmonic is selected, and thus a wavelength conversion is carried out by a nonlinear grating of the domain-inverted structure. The DBR portion 112 reflects (Bragg reflection) a fundamental wave of a certain wavelength by a grating of a refractive index.

In this structure, under the conditions as mentioned in the first embodiment, the phase matching wavelength and the DBR reflection wavelength are harmonized with each other to provide a coherent light source having a stable output.

That is, the domain-inverted structure for the DBR grating and the domain-inverted structure for the wavelength conversion can be separated from each other. Since the first-order period of the DBR grating is as small as about 0.2 µm, a high-ordered grating will be obtained by using a domain-inverted grating as the DBR grating. Therefore, by separately designing the domain inversion for the DBR and for the wavelength conversion, the respective designs can be optimized. In this case, attention should be paid to a relationship between the gain-peak wavelength of the semiconductor laser 101, the DBR reflection wavelength and the phase matching wavelength. The relationship between the respective wavelengths is described below.

The DBR reflection wavelength of the DBR portion 112 and the phase matching wavelength of the wavelength-converting portion 111 harmonize with each other; a difference between the DBR reflection wavelength of the wavelength-converting portion 111 and the DBR reflection wavelength of the DBR portion 112 is 5 nm or more; and, the DBR reflection wavelength of the DBR portion 112 and the gain-peak wavelength of the semiconductor laser 101 harmonize substantially with each other.

By designing to meet the above-mentioned conditions, the design can be optimized. As mentioned above, since the domain-inverted region 105 is accompanied with a change in refractive wavelength, the DBR reflection is caused also by the domain-inverted grating of the wavelength-converting portion 111. When a light beam emitted from the semiconductor laser 101 is fixed to the DBR reflection wavelength from the wavelength-converting portion 111, the wavelength no longer will be converted due to a difference from the phase matching wavelength. The DBR reflection wavelength from the DBR portion 112 harmonizes with the gain-peak of the semiconductor laser 101, and a difference from the DBR reflection wavelength from the wavelength-converting portion 111 is 5 nm or more, and the semiconductor laser 101 is fixed to the DBR reflection wavelength from the DBR portion 112. When the DBR reflection wavelengths of the DBR portion 112 and of the wavelength-converting portion 111 get close to each other, it will be unclear to which wavelength the light beam of the semiconductor laser 101 is fixed, thereby causing a multimode oscillation with both the wavelengths. This will cause a problem that noise is increased considerably. In view of this, it is desired that the phase matching wavelength of the wavelength-converting portion 111 and the DBR reflection wavelength are separated from each other by at least 5 nm. Therefore, the phase matching wavelength is preferably set at a wavelength having a difference increased by at least 5 nm from the wavelength under the condition where the phase matching wavelength and the DBR wavelength harmonize each other as mentioned in the first embodiment.

Furthermore, when a gain-peak of the semiconductor laser 101 is close to the DBR reflection wavelength of the wavelength-converting portion, it will be fixed to the DBR reflection wavelength and thus, a wavelength conversion may not occur. Therefore, it is preferable that the difference between the DBR reflection wavelength of the DBR portion 112 and the gain-peak wavelength of the semiconductor laser 101 is not more than 5 nm. It is more preferable that the difference between the DBR reflection wavelength of the DBR portion 112 and the gain-peak wavelength of the semiconductor laser 101 is not more than 2 nm, since the oscillation is stabilized further.

Here, the DBR portion 112 is disposed in the vicinity of the incident portion of the optical waveguide device 108a in order to shorten the distance from the semiconductor laser 101 as much as possible. When the semiconductor laser 101 is fixed by the light beam reflected from the DBR portion 112, light from the DBR portion 112 is fed back to the semiconductor laser 101. In general, noise in the semiconductor laser 101 is increased considerably due to light returning from outside. Therefore, when light returns to the semiconductor laser 101, the laser will have an external resonator structure as well as its inherent resonator structure, i.e., the laser will have a composite resonator structure.

Therefore, when the DBR portion 112 is disposed in the vicinity of the outlet of the optical waveguide device 108a (opposite to the semiconductor laser 101), the resonator lengths of the composite resonators will be different from each other, and the resonator lengths will change substantially under influences of the ambient temperature change or the like. As a result, the resonator structure will be unstable and the oscillation noise will be increased.

On the other hand, when the semiconductor laser 101 and the optical waveguide device 108a are bonded directly to each other and the DBR portion 112 is disposed at the incident end side (semiconductor laser 101 side) of the optical waveguide device 108a, the emission end face of the semiconductor laser 101 and the reflection end face of the DBR grating can harmonize substantially with each other, thereby preventing noise caused by the composite resonator structure.

As mentioned above, it is required that the DBR portion 112 be arranged in the vicinity of the incident end face of the optical waveguide device 108a and the DBR grating be formed up to the incident end face. The same can be applied to the first embodiment. Similarly, when a phase matching grating is used as the DBR grating, the semiconductor laser 101 preferably is bonded directly. It is also preferable that the domain-inverted region 105 also is formed up to the incident end face of the optical waveguide device 108a.

The output of the coherent light source 100a may be turbulent due to modulation of the output by modulating the driving current of the semiconductor laser 101. That is, when a temperature change occurs in the semiconductor laser 101 due to the driving current, the resonator length of the semiconductor laser 101 changes, and thus the oscillation wavelength of the semiconductor laser 101 changes. In other words, when the output of the semiconductor laser 101 is modulated, the oscillation wavelength will be modulated at the same time.

For the nonlinear optical crystal, Mg-doped LiNb$_{(1-x)}$Ta$_x$O$_3$ ($0 \leq x \leq 1$) can be used as well. For example, any of the following crystals can be used similarly for the nonlinear optical crystal: Mg-doped LiTaO$_3$, Mg-doped LiNbO$_3$, mixed crystal of Mg-doped LiNbO$_3$ and LiTaO$_3$, Mg-doped stoichiometric LiNbO$_3$, Mg-doped stoichiometric LiTaO$_3$, and a mixed crystal of Mg-doped stoichiometric LiNbO$_3$ and Mg-doped stoichiometric LiTaO$_3$.

The optical waveguide device 108a has a narrow wavelength tolerance, and thus the conversion efficiency will change considerably even at a small wavelength fluctuation of not more than 0.1 nm. Therefore, in the output modulation of the semiconductor laser 101, the harmonic output changes due to the modulation of both the output of the semiconductor laser 101 and the wavelength, thereby forming a complicated output waveform. As a result, it will be difficult to modulate the output of the optical wavelength converter at a waveform required for stability. For preventing this, a normal Fabry-Perot semiconductor laser is used for the semiconductor laser 101. Alternatively, a semiconductor laser having a phase modulating portion can be used. By adding a phase modulating portion (not shown) to the semiconductor laser 101 and modulating the current applied to the phase modulating portion, it will be possible to suppress a wavelength fluctuation occurring at the time of output modulation of the semiconductor laser and facilitate the output modulation of the wavelength converter. In the first embodiment, similar effects can be obtained by adding a phase modulating portion to the semiconductor laser 101.

THIRD EMBODIMENT

Figure 6:
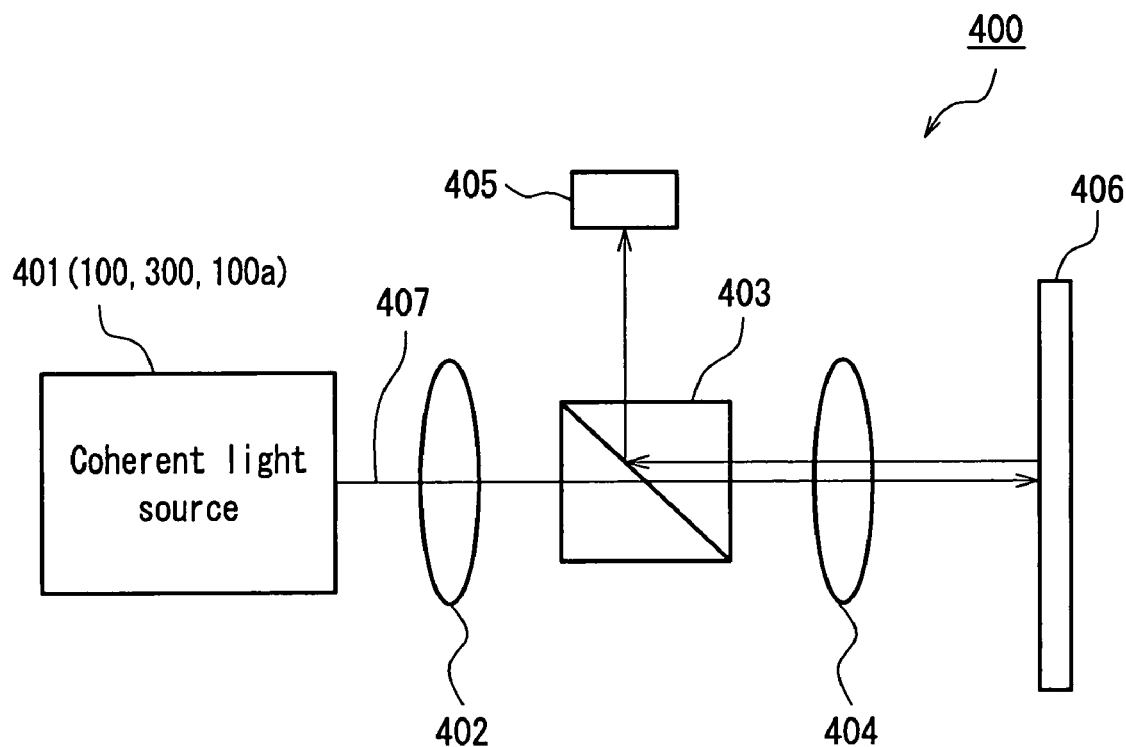
FIG. 6 is a schematic view showing a configuration of an optical apparatus according to a third embodiment.

An embodiment of an optical apparatus of the present invention will be described below. Examples of the optical apparatus include an optical pickup apparatus. FIG. 6 is a schematic view showing a configuration of an optical pickup system according to a third embodiment. An optical pickup apparatus 400 according to the third embodiment has a coherent light source 401, lenses 402 and 404 as convergent optical systems, a beam splitter 403 and a photodetector 405. For the coherent light source 401, any of the coherent light sources 100, 300 and 100a in the first and second embodiments as illustrated in FIGS. 1, 4 and 5 can be used.

As shown in FIG. 6, a light beam 407 emitted from the coherent light source 401 passes through the lens 402 as an optical convergent system, the beam splitter 403 and the lens 404 as an optical convergent system so as to be converged on the surface of an optical disk 406. The thus converged light beam is reflected on the surface of the optical disk 406, passing again through the lens 404 and changing its traveling direction with the beam splitter 403, and is guided to the photodetector 405. By detecting the light beam reflected at the optical disk 406 by using the photodetector 405, information that is written on the optical disk 406 can be read out. It is also possible to converge the light beam 407 emitted from the coherent light source 401 on the optical disk 406, thereby writing information on the optical disk 406.

Since the coherent light source 401 is any of the coherent light sources 100, 300 and 100a in the first and second embodiments, as mentioned above, it can emit a short wavelength light beam having a wavelength of 410 nm. Therefore, an optical information recording with a high-density can be performed.

Since the coherent light source 401 (coherent light source 100, 300 or 100a) confines light in an optical waveguide having width and thickness of several micrometers, the optical waveguide will have a remarkably intensified power density. Therefore, a temperature distribution is generated in the transmission direction in the optical waveguide. Due to this temperature distribution, a distribution of a phase matching condition for converting a fundamental wave to a harmonic will be generated. As a result, a phase matching condition will be difficult to establish, and the output of the coherent light source 401 (coherent light source 100, 300 or 100a) may deteriorate. However, since bonding layers 104, 304, 104a of metal having a high heat conductivity are used for the coherent light sources 100, 300 and 100a, the heat conductivity of the optical waveguide will be improved and thus the temperature distribution of the optical waveguide can be reduced. Thereby, a high-output coherent light source 401 (coherent light source 100, 300 or 100a) was provided. In the optical pickup apparatus 400 according to the third embodiment, a short wavelength light beam of 50 mW or more can be provided, which enables writing on a two-layered disk, which is difficult for a low output. Furthermore, it can realize a high-speed writing.

For optical apparatuses having the coherent light sources 100, 300 and 100a according to the first to third embodiments, for example, a coherent optical system apparatus such as a laser scanning microscope can be used, as well as the above-mentioned optical pickup optical system apparatus.

According to the present invention, a wavelength of a semiconductor laser can be stabilized due to entering of light emitted from a semiconductor laser, and thus an optical device that can realize a coherent light source with a high and stable output can be provided.

INDUSTRIAL APPLICABILITY

An optical waveguide device of the present invention, a coherent light source using the same and an optical apparatus having the same are used, for example, in the field of optical information processing and optical application measuring control.

The invention claimed is:

1. An optical waveguide device comprising:
a substrate composed of a nonlinear optical material and
a periodically domain-inverted structure having the same composition as the nonlinear optical material, wherein
the domain-inverted structure has a refractive index distribution relying on the domain-inverted structure,
the nonlinear optical material is a Mg-doped $LiNbO_3$ crystal,
a phase matching wavelength harmonizes with a Bragg reflection wavelength, and
the Bragg reflection wavelength $\lambda$ satisfies a relationship of $\lambda_1 < \lambda < \lambda_2$ when $\lambda_1 = 635 + 48 \times n$ (nm), $\lambda_2 = 1.02 \times \lambda_1$ (nm) where (n=0, 1, 2), or $\lambda_1 = 774 + 40 \times n$ (nm), $\lambda_2 = 1.02 \times \lambda_1$ (nm) where (n=0, 2, 3, 4 . . . ).

2. The optical waveguide device according to claim 1, wherein the domain-inverted structure is formed by applying a voltage in a polarization direction of the substrate.

3. The optical waveguide device according to claim 1, wherein the substrate composed of a nonlinear optical material is an offcut substrate.

4. The optical waveguide device according to claim 3, wherein the substrate has an offcut angle inclined in a range of 1° to 10° with respect to the substrate surface.

5. The optical waveguide device according to claim 1, wherein the substrate is a thin film, having an optical substrate bonded via a bonding layer to one face of the substrate.

6. The optical waveguide device according to claim 5, wherein at least either the surface or a back face of the substrate is provided with a convex, and the domain-inverted structure is formed in stripes at the convex.

7. The optical waveguide device according to claim 1, wherein the nonlinear optical material is a Mg-doped $LiNb_{(1-x)}Ta_xO_3$ ($0 \leq x \leq 1$).

8. A coherent light source comprising a semiconductor laser and an optical waveguide device according to claim 1, where a light beam emitted from the semiconductor laser enters the optical waveguide device.

9. An optical apparatus comprising the coherent light source according to claim 8.

10. An optical waveguide device comprising:
a substrate composed of a nonlinear optical material and
a periodically domain-inverted structure having the same composition as the nonlinear optical material, wherein
the domain-inverted structure has a refractive index distribution relying on the domain-inverted structure,
the nonlinear optical material is a Mg-doped $LiNbO_3$ crystal,
a phase matching wavelength harmonizes with a Bragg reflection wavelength, and
the Bragg reflection wavelength $\lambda$ satisfies a relationship of $\lambda_1 < \lambda < \lambda_2$ when $\lambda_1 = 613 + 48 \times n$ (nm), $\lambda_2 = 1.02 \times \lambda_1$ (nm) where (n=0, 1, 2), or $\lambda_1 = 754 + 40 \times n$ (nm), $\lambda_2 = 1.02 \times \lambda_1$ (nm) where (n=0, 1, 2, 3, 4 . . . ).

11. The optical waveguide device according to claim 10, wherein the domain-inverted structure is formed by applying a voltage in a polarization direction of the substrate.

12. The optical waveguide device according to claim 10, wherein the substrate composed of a nonlinear optical material is am offcut substrate.

13. The optical waveguide device according to claim 12, wherein the substrate has an offcut angle inclined in a range of 1° to 10° with respect to the substrate surface.

14. The optical waveguide device according to claim 10, wherein the substrate is a thin film, having an optical substrate bonded via a bonding layer to one face of the substrate.

15. The optical waveguide device according to claim 14, wherein at least either the surface or a back face of the substrate is provided with a convex, and the domain-inverted structure is formed in stripes at the convex.

16. The optical waveguide device according to claim 10, wherein the nonlinear optical material is a Mg-doped LiNb$_{(1-x)}$Ta$_x$O$_3$ ($0 \leq x \leq 1$).

17. A coherent light source comprising a semiconductor laser and an optical waveguide device according to claim 10, where a light beam emitted from the semiconductor laser enters the optical waveguide device.

18. An optical apparatus comprising the coherent light source according to claim 17.

19. An optical waveguide device comprising:
a substrate composed of a nonlinear optical material and
a periodically domain-inverted structure having the same composition as the nonlinear optical material, wherein
the domain-inverted structure has a refractive index distribution relying on the domain-inverted structure,
the domain-inverted structure is composed of a wavelength-converting portion and a DBR portion, and
the phase matching wavelength of the wavelength-converting portion is equal to the Bragg reflection wavelength of the DBR portion, and a difference between the phase matching wavelength of the wavelength-converting portion and the Bragg reflection wavelength of the wavelength-converting portion is at least 5 nm.

20. The optical waveguide device according to claim 19, wherein the domain-inverted structure is formed by applying a voltage in a polarization direction of the substrate.

21. The optical waveguide device according to claim 19, wherein the substrate composed of a nonlinear optical material is an offcut substrate.

22. The optical waveguide device according to claim 21, wherein the substrate has an offcut angle inclined in a range of 1° to 10° with respect to the substrate surface.

23. The optical waveguide device according to claim 19, wherein the substrate is a thin film, having am optical substrate bonded via a bonding layer to one face of the substrate.

24. The optical waveguide device according to claim 23, wherein at least either the surface or a back face of the substrate is provided with a convex, and the domain-inverted structure is formed in stripes at the convex.

25. The optical waveguide device according to claim 19, wherein the nonlinear optical material is a Mg-doped LiNb$_{(1-x)}$Ta$_x$O$_3$ ($0 \leq x \leq 1$).

26. A coherent light source comprising a semiconductor laser and an optical waveguide device according to claim 19, where a light beam emitted from the semiconductor laser enters the optical waveguide device.

27. An optical apparatus comprising the coherent light source according to claim 26.

* * * * *

UNITED STATES PATENT AND TRADEMARK OFFICE
CERTIFICATE OF CORRECTION

PATENT NO.         : 7,236,674 B2
APPLICATION NO. : 10/542299
DATED               : June 26, 2007
INVENTOR(S)       : Mizuuchi et al.

It is certified that error appears in the above-identified patent and that said Letters Patent is hereby corrected as shown below:

Column 16, line 6(claim1): "(n=0, 2, 3, 4 . . .)" should read --(n=0, 1, 2, 3, 4, . . .)--.
Column 16, line 55(claim 12): "am" should read --an--.
Column 18, line 8(claim 23): "am" should read --an--.

Signed and Sealed this

Sixth Day of November, 2007

JON W. DUDAS
*Director of the United States Patent and Trademark Office*